(12) United States Patent
Gutalj et al.

(10) Patent No.: US 7,031,135 B2
(45) Date of Patent: Apr. 18, 2006

(54) CAPACITOR WITH HIGH THERMAL STABILITY FOR SHIELDED ELECTRICAL LINES

(75) Inventors: Vladimir Gutalj, Oberentfelden (CH); Robert Luscher, Seon (CH); Bernard Regnier, Aix les Bains (FR); Jean-Pierre Dupraz, Bressolles (FR)

(73) Assignee: Alstom, Paris (FR)

( * ) Notice: Subject to any disclaimer, the term of this patent is extended or adjusted under 35 U.S.C. 154(b) by 389 days.

(21) Appl. No.: 10/198,929

(22) Filed: Jul. 22, 2002

(65) Prior Publication Data

US 2003/0030962 A1 Feb. 13, 2003

(30) Foreign Application Priority Data

Jul. 25, 2001 (FR) .................... 01 09886

(51) Int. Cl.
*H02M 3/06* (2006.01)

(52) U.S. Cl. .................... 361/274.1; 307/109

(58) Field of Classification Search ............... 307/129, 307/109; 361/274.1, 749; 174/254
See application file for complete search history.

(56) References Cited

U.S. PATENT DOCUMENTS

| 3,646,412 | A |   | 2/1972 | Boersma et al. |
|---|---|---|---|---|
| 3,755,891 | A | * | 9/1973 | Muckelroy et al. ............ 29/846 |
| 4,810,954 | A | * | 3/1989 | Fam ............................ 324/142 |
| 5,444,599 | A | * | 8/1995 | Dupraz et al. ............ 361/274.1 |

FOREIGN PATENT DOCUMENTS

| DE | 2409595 A1 | 8/1975 |
|---|---|---|
| DE | 2641574 A1 | 3/1978 |
| DE | 4229680 A1 | 3/1994 |
| EP | 0780692 A3 | 6/1997 |

OTHER PUBLICATIONS

Falkner, A.H.; "The use of capacitance in the measurement of angular and linear displacement", Instrumentation and Measurement, IEEE Transactions on, vol.: 43, Issue: 6, Dec. 1994 pp.: 939-942.*

* cited by examiner

*Primary Examiner*—Brian Sircus
*Assistant Examiner*—Brett Squires
(74) *Attorney, Agent, or Firm*—Sughrue Mion, PLLC

(57) ABSTRACT

The capacitor of high thermal stability includes a high-voltage electrode (HT) extending in a longitudinal direction (AX), a cylindrical printed circuit (CI) coaxially surrounding said high-voltage electrode and including an electrically conductive track forming a low-voltage electrode (BT), and a frame (CH) having a cylindrical inside surface (SI) coaxially surrounding said cylindrical printed circuit (CI). The printed circuit is slit along a generatrix (G1) of the cylinder that it forms and it is rigidly fixed to the inside surface by a fixing point (F1, F2). The frame includes guide means (A1, A2) for holding said printed circuit (CI) near the inside surface (SI) whilst allowing it to expand along said inside surface of the frame. This provides a capacitor of high thermal stability and very simple construction which is suitable for carrying out measurements on a gas-insulated high-voltage electrical line.

8 Claims, 3 Drawing Sheets

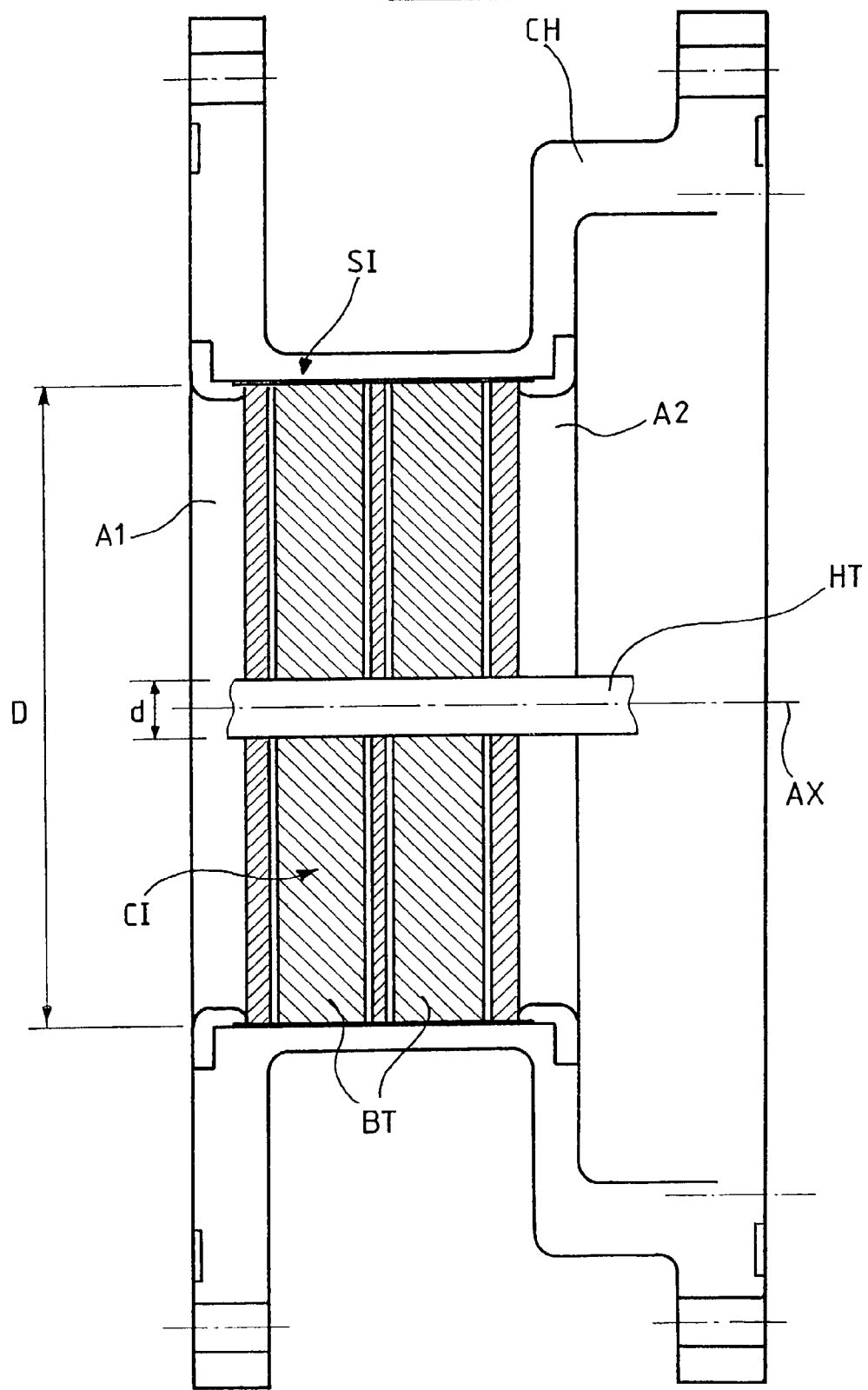

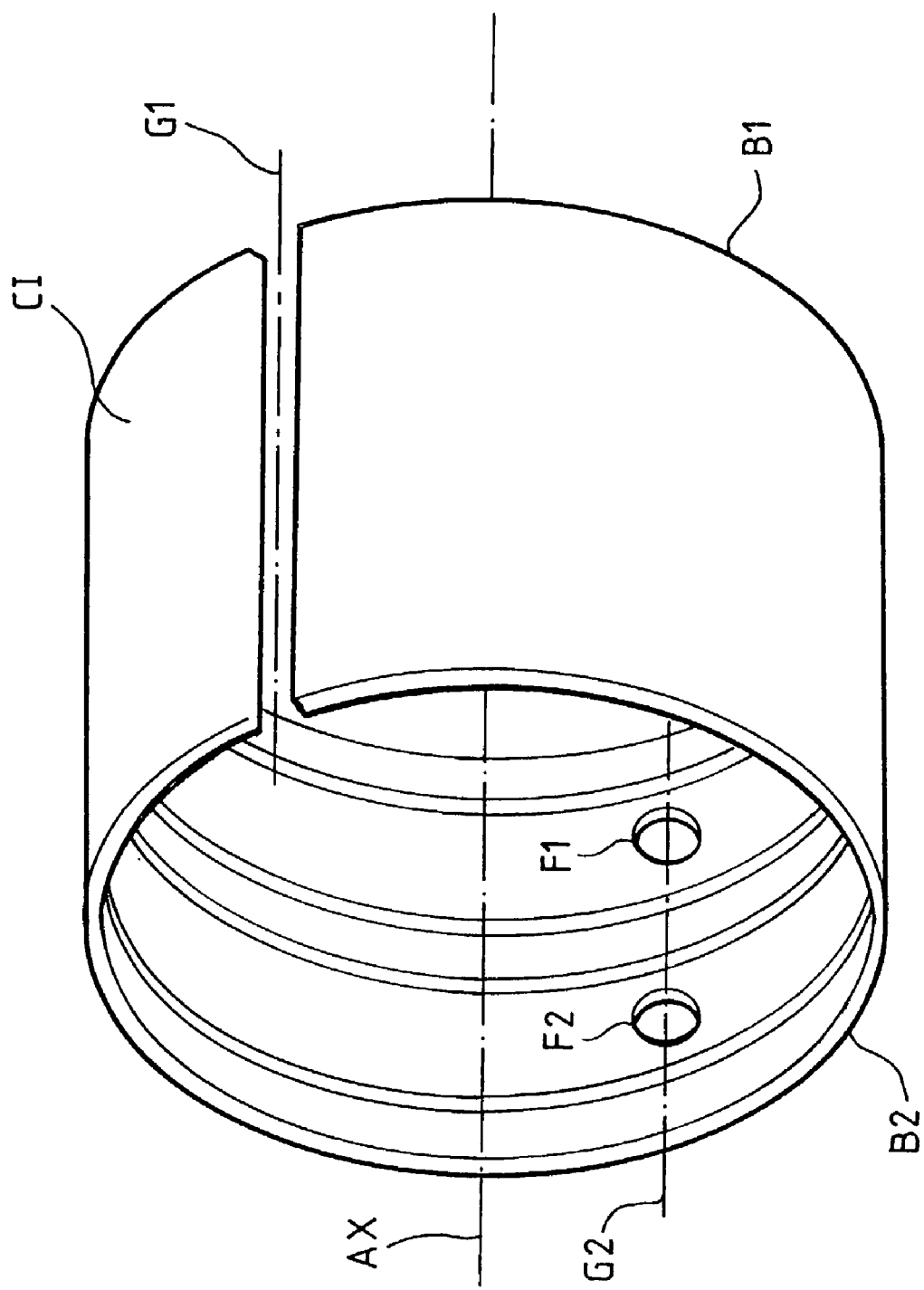
FIG_2

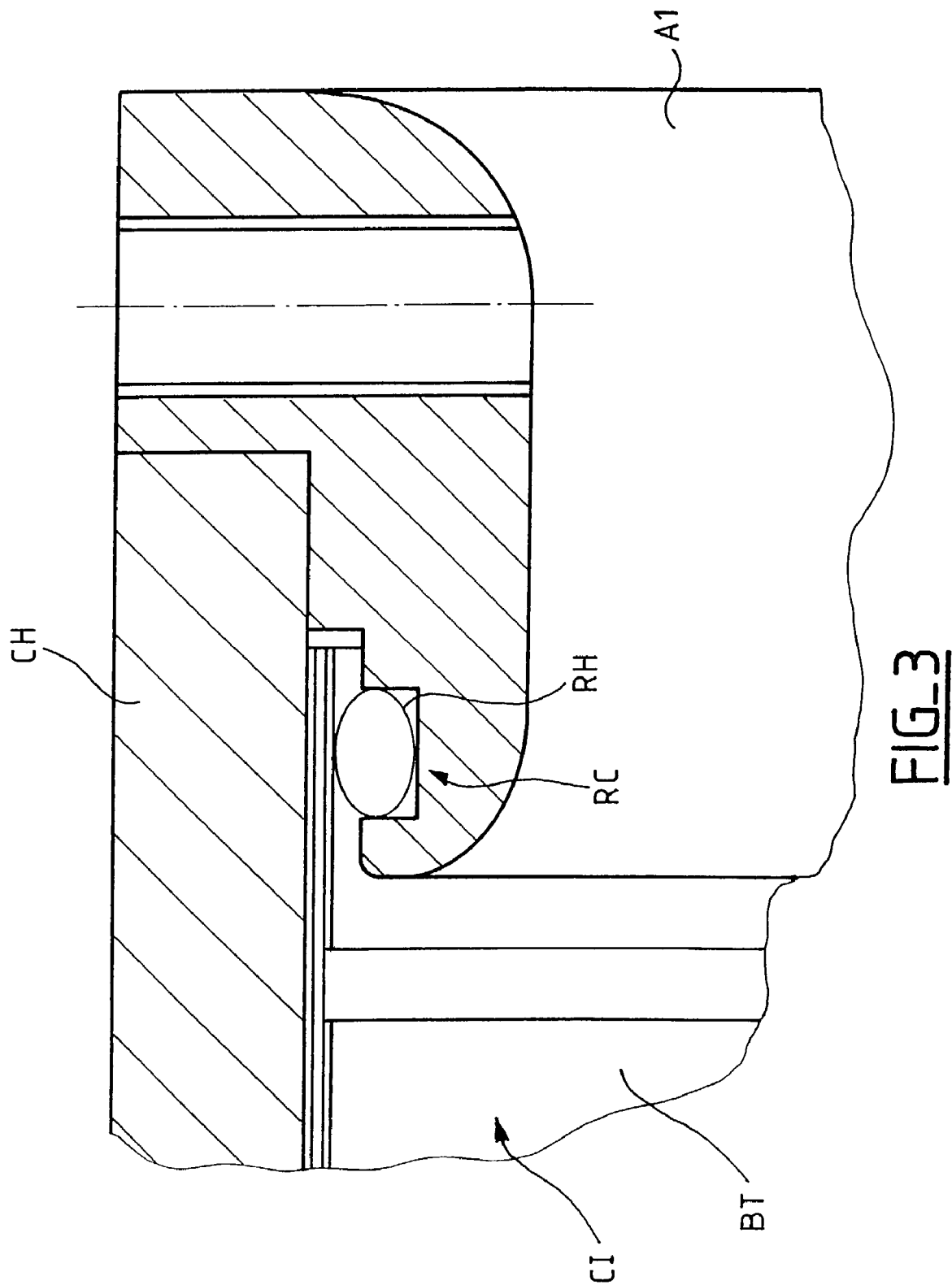

CAPACITOR WITH HIGH THERMAL STABILITY FOR SHIELDED ELECTRICAL LINES

BACKGROUND OF THE INVENTION

1. Field of the Invention

The invention relates to a capacitor of high thermal stability for carrying out measurements on a gas-insulated high-voltage line, including a high-voltage electrode extending in a longitudinal direction, a cylindrical printed circuit coaxially surrounding said high-voltage electrode and including an electrically conductive track forming a low-voltage electrode, and a frame having a cylindrical inside surface coaxially surrounding said cylindrical printed circuit, which is held by said frame.

2. Background Art

A capacitor of this kind is intended in particular for metal-clad electrical switchgear, i.e. switchgear insulated by a gas such as $SF_6$, for example. It is used to measure the voltage of a high-voltage member such as a cable of a shielded high-voltage line. The high-voltage member is electrically connected to the high-voltage electrode of the capacitor and the frame of the capacitor is electrically connected to ground. A system of this kind is installed in an electrical distribution substation at the output of electrical power generation plant, for example.

The high-voltage electrode of the capacitor, which generally consists of a round-section metal rod, is surrounded by the low-voltage electrode, which is fixed to the frame but electrically insulated from it. The frame of the capacitor is connected to ground to form a capacitive divider bridge between the high-voltage electrode and ground. To be more specific, the divider bridge includes a first capacitor consisting of the high-voltage electrode and the low-voltage electrode and which is connected in series with a second capacitor consisting of the low-voltage electrode and the frame. The voltage at the low-voltage electrode is therefore an image of the high voltage and the low-voltage electrode is connected to a measuring device.

With an arrangement of the above kind, the measured voltage values are in particular a function of the capacitance C of the first capacitor, which is given by the well known equation:

$$C = K \cdot \frac{S}{D \cdot \ln\left(\frac{D}{d}\right)} \quad (1)$$

in which K is a constant, D and S are the diameter and the surface area of the low-voltage electrode, and d is the diameter of the high-voltage electrode. This type of capacitor is generally installed outdoors and is subject to temperature variations from −40° C. to +80° C. These fluctuations cause expansion or contraction of the materials from which it is made, which causes its capacitance to vary in wide proportions, since the dimensions of the materials change in accordance with the well known equation:

$$L(T) = L_0(1 + a \cdot (T - T_0)) \quad (2)$$

in which L(T) is a length at temperature T, $L_0$ the same length at a reference temperature $T_0$ and a is the coefficient of linear expansion of the corresponding material. An increase in temperature increases the surface area S and the diameter D of the low-voltage electrode, which varies the capacitance of the capacitor, because of equations (1) and (2). Thus temperature fluctuations induce capacitance variations that interfere with the accuracy of the measurements.

In designing this kind of capacitor, the aim is therefore to minimize the effect of temperature on the capacitance to obtain thermal stability yielding satisfactory measurement accuracy. Optimization generally consists in designing a particular mechanical architecture that is associated with a choice of materials having suitable coefficients of expansion.

French patent FR-2705492 discloses a capacitor of the kind referred to above in which the low-voltage electrode consists of a plurality of curved plates along the inside periphery of the frame. The plates are fixed to the frame but free to expand or contract. In this prior art capacitor, the variation in the diameter of the low-voltage electrode is therefore conditioned by the coefficient of expansion of the material from which the frame is made, because the plates are fixed to the frame. Variations in the surface area of the low-voltage electrode are conditioned by the coefficient expansion of the material or materials of the plates. By combining equations (1) and (2) it can be shown that thermal stability is satisfactory if the ratio of the coefficient of thermal expansion of the material of the frame to that of the material of the low-voltage electrode is from 1.5 to 2.5. The above prior art capacitor has satisfactory thermal stability but is costly to manufacture because of the necessity to fix a plurality of plates to the inside periphery of the frame.

German patent DE-2409595 discloses a cylindrical capacitor enclosing a cylindrical printed circuit whose inside face is coated with a metal layer to form the low-voltage electrode. This form of construction with a cylindrical printed circuit for the low-voltage electrode is very simple and reduces the cost of fabrication. However, the cylindrical printed circuit is free to expand and contract inside the frame when the temperature varies, and this makes the capacitor too sensitive to temperature variations.

The aim of the invention is to remedy these drawbacks by proposing a capacitor of high thermal stability and simple construction.

SUMMARY OF THE INVENTION

To this end, the invention provides a capacitor of high thermal stability for carrying out measurements on a gas-insulated high-voltage line, including a high-voltage electrode extending in a longitudinal direction, a cylindrical printed circuit coaxially surrounding said high-voltage electrode and including an electrically conductive track forming a low-voltage electrode, and a frame having a cylindrical inside surface coaxially surrounding said cylindrical printed circuit, which is held by said frame, characterized in that said printed circuit is slit along a generatrix of the cylinder that it forms and in that said frame includes guide means for holding said printed circuit near the inside surface whilst allowing it to expand along said inside surface.

With this kind of construction, and an appropriate choice of the coefficients of thermal expansion of the materials of the low-voltage electrode and the frame, a capacitor is obtained of high thermal stability and very simple construction.

In one preferred embodiment of the capacitor according to the invention, a plurality of fixing points for fixing the printed circuit are provided on the inside surface of the frame, said fixing points being distributed along another generatrix of the cylinder formed by the printed circuit symmetrical to the generatrix along which the cylinder is slit with respect to the longitudinal direction. With this form of construction, there is no risk of the printed circuit becoming wedged in the frame.

In another particular embodiment of the capacitor according to the invention, the guide means are two profiled rings fixed along the inside surface of the frame, said rings each having an L-shaped section to form with said inside surface two circular grooves facing each other and each having a U-shaped section, the cylinder that the printed circuit forms having its bases nested in each groove. With this form of construction, the means on the frame for guiding the printed circuit consists mainly of two parts, with a view to simplifying assembling the capacitor and reducing its cost.

In a further particular embodiment of the capacitor according to the invention, each ring includes a circular groove extending all around its periphery and facing the printed circuit, and wherein a respective helicoidal spring is housed in each groove, said springs having their turns in substantially radial planes, each turn bearing on the printed circuit to hold it pressed onto the inside surface of the frame. With this form of construction, the width of the grooves can be significantly greater than the thickness of the printed circuit, to facilitate nesting the printed circuit.

In a further particular embodiment of the capacitor according to the invention, said printed circuit has coefficients of thermal expansion $a_x$, $a_y$ respectively in the longitudinal direction and along its periphery that are related to the coefficient of thermal expansion $a_c$ of the frame by the condition:

$$0.75 \leq \frac{a_x + a_y}{a_c} \leq 1.25$$

With this form of construction, the capacitor has a thermal drift less than 0.085% for a range of temperature from −40° C. to +80° C.

BRIEF DESCRIPTION OF THE DRAWINGS

The invention will now be described in more detail and with reference to the accompanying drawings, which show one embodiment of the invention by way of non-limiting example.

FIG. 1 is a perspective view of the capacitor according to the invention.

FIG. 2 is a perspective view of the cylindrical printed circuit.

FIG. 3 is a view in section of a ring on the frame for guiding the printed circuit.

DESCRIPTION OF THE EXEMPLARY EMBODIMENTS

The high thermal stability capacitor in accordance with the invention is cylindrical. It has a high-voltage electrode HT which extends in a main direction AX, as shown in FIG. 1, which is a view of the capacitor in a section plane containing the axis AX. The electrode HT, which here is a round-section metal rod of diameter d, is coaxially surrounded by a low-voltage electrode BT in the form of an electrically conductive track on a cylindrical printed circuit CI of diameter D. The printed circuit is retained in a metal frame CH intended to be coupled to metal-clad switchgear filled with $SF_6$. In this example, the cylindrical printed circuit CI has five separate electrically conductive tracks on its inside face. The tracks form circular bands represented in the drawings by shaded areas and spaced from each other along the axis AX. These bands are not necessarily interconnected at the level of the printed circuit. To be more specific, the central tracks, which are not connected to the ground of the frame CH, can serve as the low-voltage electrode BT independently of each other. The frame CH has a cylindrical inside surface SI coaxial with the axis AX and surrounding the printed circuit CI to hold it in position relative to the high-voltage electrode HT. As in some prior art capacitors, the frame is connected to ground to form a capacitive divider bridge between the high-voltage electrode HT and ground. The voltage of the low-voltage BT electrode therefore images the voltage of the high-voltage electrode and the low-voltage electrode is electrically connected to a measuring device, not shown. The measuring system can be connected to one or more conductive bands of the cylindrical printed circuit CI to measure one or more electrical potentials relative to the ground of the frame. Note that the cylindrical printed circuit CI also has a conductive track on its outside surface connected to ground via the frame.

In accordance with the invention, the printed circuit CI is slit along one generatrix G1 of the cylinder that it forms, as shown in FIG. 2, and the frame includes guide means A1, A2 for holding the printed circuit CI in position in the frame. The guide means are adapted to hold the printed circuit CI close to the inside surface SI of the frame CH, at a substantially constant distance therefrom, whilst allowing it to expand along the inside surface SI. The printed circuit CI can be held by the guide means A1, A2 at a small distance from the inside surface SI of the frame or pressed against it. The width of the slit in the printed circuit CI therefore fluctuates with temperature variations.

The printed circuit CI is preferably fixed to the frame at one or more fixing points to prevent it turning indefinitely inside the cylindrical inside surface SI of the frame. With this arrangement, the printed circuit is free to expand or contract along the inside surface SI as a result of temperature fluctuations, but its diameter D is imposed by the inside surface SI of the frame. As in the capacitor from the document FR-2705492, the variation in the surface area S of the electrode BT is conditioned by the coefficient of expansion of the electrode BT and the variation in its diameter D is conditioned by the coefficient of expansion of the frame CH. It follows that an appropriate choice of the coefficients of expansion of the electrode BT and the frame CH achieves satisfactory thermal stability, as explained in the document previously cited.

Accordingly, the capacitor according to the invention has satisfactory thermal stability but is of simpler design than the capacitor disclosed in the document FR-2705492.

The electrode BT in accordance with the invention consists of a single printed circuit, whereas in the document FR-2705492 it consists of a plurality of curved plates fixed separately to the frame.

The printed circuit CI is preferably fixed to the frame at a plurality of fixing points F1 and F2 shown in FIG. 2 and distributed along a generatrix G2 of the cylinder that the circuit CI forms, the generatrix G2 being symmetrical to the generatrix G1 along which the cylinder is slit with respect to the longitudinal direction AX. A plurality of fixing points F1 and F2 distributed along the same generatrix, such as the generatrix G2, guarantees that movements of the printed circuit CI along the inside surface SI of the frame are homogeneous, i.e. that there is no risk of the printed circuit wedging against the inside surface of the frame. The fixing points F1 and F2 can simply be holes in the circuit CI intended to receive complementary screws that are screwed into corresponding tapped holes in the inside surface SI of the frame. Because the fixing points F1 and F2 face the slit in the cylinder CI, movements of the printed circuit relative to the frame are minimized. Other fixing systems can equally well be used without departing from the scope of the invention.

The means on the inside surface SI of the frame for guiding the circuit CI can be of various kinds, for example with members attached to the printed circuit and sliding in corresponding grooves formed on the inside surface SI of the frame. In a preferred embodiment, the guide means consist of two rings A1, A2 coaxial with and fixed to the cylindrical surface SI. Each ring has an L-shaped cross section, as can be seen in FIG. 3, and the two rings are mounted at respective ends of the cylinder formed by the surface SI to form therewith two circular grooves having a U-shaped cross section. The depth of the grooves is slightly greater than the thickness of the printed circuit CI, so that it can be nested in them. Accordingly, the cylinder formed by the printed circuit CI has each of its circular bases B1, B2 nested in one of the grooves to hold it at a constant distance from the cylindrical surface SI of the frame, whilst being able to expand along that surface by sliding in the grooves. With an arrangement of this kind, assembling the component parts of the capacitor is a very simple matter because it can consist of fixing the printed circuit CI to the frame at the points F1 and F2 and then fitting the two rings A1 and A2 and fixing them to the frame CH, at the same time nesting the printed circuit CI in the grooves defined by the rings and the inside surface SI of the frame. The rings can be screwed to the frame, for example.

In another particular embodiment of the capacitor according to the invention, the printed circuit CI that is guided by said grooves is pressed by a spring against the surface SI of the frame. To achieve this, each profiled ring incorporates a circular groove RC that extends all around the outside periphery of the ring and faces the printed circuit CI, as can be seen in FIG. 3. Here the groove RC has a rectangular cross section and receives a toroidal coil spring RH. The spring RH is therefore housed in the groove RC with its turns in substantially radial planes. This mounting of the spring RH in the ring is similar to the mounting of the toroidal spring of a lip seal for a rotary shaft, also known as a toroidal seal. In this embodiment, each turn of the spring RH is compressed between the groove RC and the cylindrical circuit CI and each turn therefore bears on the printed circuit to hold it pressed against the cylindrical surface SI of the frame. Thus the grooves can have a depth significantly greater than the thickness of the printed circuit to facilitate nesting its bases in the grooves during assembly. With this arrangement, the circuit is pressed against the cylindrical surface SI of the frame to improve further the thermal stability of the capacitor and to reduce even further the risks of the printed circuit becoming wedged with respect to the frame. This arrangement helps to simplify assembling the component parts of the capacitor according to the invention because the guide grooves can be made larger.

In another preferred embodiment of the capacitor the coefficient of expansion $a_c$ of the frame CH and the coefficients of expansion $a_x$ and $a_y$ of the printed circuit CI satisfy the condition:

$$0.75 \le \frac{a_x + a_y}{a_c} \le 1.25$$

in which $a_x$ and $a_y$ respectively designate the coefficients of linear expansion of the printed circuit in the direction AX and along the surface SI. By combining equations (1) and (2) it can be shown that the sensitivity of the capacitance C of the capacitor to temperature variations is principally conditioned by these three coefficients of expansion, as follows:

$$C(T) \approx K' \cdot \frac{1 + (a_x + a_y) \cdot (T - T_0)}{1 + a_c \cdot (T - T_0)}$$

where C(T) is the capacitance of the capacitor at temperature T and K' is a constant. The above equation shows that, if $a_x + a_y = a_c$, the capacitor is insensitive to temperature variations. More generally, it can be shown that if the ratio of the coefficients of expansion is from 0.75 to 1.25, the capacitance variation for a temperature fluctuating from −40° C. to +80° C. is less than 0.085% of the nominal capacitance.

The printed circuit CI of the capacitor according to the invention is preferably fabricated on an epoxy resin base and its frame CH is advantageously made of aluminum. The coefficient of linear expansion of the printed circuit CI is then approximately $a_x + a_y = 21 \times 10^{-6}$ °C./m and that of the aluminum frame CH is $a_c = 23.3 \times 10^{-6}$ °C./m, which yields a capacitance variation less than 0.03% of the nominal capacitance for a temperature fluctuating from −40° C. to +80° C.

The invention claimed is:

1. A capacitor of high thermal stability for carrying out measurements on a gas-insulated high-voltage line, comprising:

a high-voltage electrode extending in a longitudinal direction, a cylindrical printed circuit coaxially surrounding said high-voltage electrode, said cylindrical printed circuit comprising an electrically conductive track forming a low-voltage electrode, and a frame comprising a cylindrical inside surface coaxially surrounding said cylindrical printed circuit held by said frame, wherein said cylindrical printed circuit is slit along a generatrix of the cylinder that it forms and said frame comprises guide means for holding said cylindrical printed circuit near the cylindrical inside surface and allowing said cylindrical printed circuit to expand along said cylindrical inside surfaces, said capacitor of high thermal stability further comprising a plurality of fixing points for fixing the cylindrical printed circuit to the cylindrical inside surface, said fixing points being distributed along another generatrix of the cylinder formed by the cylindrical printed circuit symmetrical to the generatrix along which the cylinder is slit with respect to the longitudinal direction.

2. A capacitor according to claim 1, wherein said cylindrical printed circuit has coefficients of thermal expansion $a_x$, $a_y$ respectively in the longitudinal direction and along its periphery that are related to the coefficient of thermal expansion $a_c$ of the frame by the condition:

$$0.75 \le \frac{a_x + a_y}{a_c} \le 1.25.$$

3. A capacitor according to claim 1, wherein said electrically conductive track of the cylindrical printed circuit is substantially annular.

4. A capacitor according to claim 1, wherein the another generatrix of the cylinder formed by the cylindrical printed circuit is parallel to the generatrix along which the cylinder is slit with respect to the longitudinal direction.

5. A capacitor according to claim 1, wherein the guide means are substantially annular.

6. A capacitor of high thermal stability for carrying out measurements on a gas-insulated high-voltage line, comprising:
- a high-voltage electrode extending in a longitudinal direction,
- a cylindrical printed circuit coaxially surrounding said high-voltage electrode, said cylindrical printed circuit comprising an electrically conductive track forming a low-voltage electrode, and
- a frame comprising a cylindrical inside surface coaxially surrounding said cylindrical printed circuit held by said frame,
- wherein said cylindrical printed circuit is slit along a generatrix of the cylinder that it forms and said frame comprises guide means for holding said cylindrical printed circuit near the cylindrical inside surface and allowing said cylindrical printed circuit to expand along said cylindrical inside surface, and
- wherein the guide means are two profiled rings fixed along the cylindrical inside surface of the frame, said profiled rings each having an L-shaped section to form with said cylindrical inside surface two circular grooves facing each other and each having a U-shaped section, the cylinder that the cylindrical printed circuit forms having its bases nested in the two circular grooves.

7. A capacitor according to claim 6, wherein each profiled ring includes a circular groove extending all around its periphery and facing the cylindrical printed circuit, and wherein a respective helicoidal spring is housed in each circular groove, said helicoidal springs having their turns in substantially radial planes, each turn bearing on the cylindrical printed circuit to hold it pressed onto the cylindrical inside surface of the frame.

8. A capacitor of high thermal stability for carrying out measurements on a gas-insulated high-voltage line, comprising:
- a high-voltage electrode extending in a longitudinal direction,
- a cylindrical printed circuit coaxially surrounding said high-voltage electrode, said cylindrical printed circuit comprising an electrically conductive track forming a low-voltage electrode, and
- a frame comprising a cylindrical inside surface coaxially surrounding said cylindrical printed circuit held by said frame,
- wherein said cylindrical printed circuit is slit along a generatrix of the cylinder that it forms and said frame comprises guide means for holding said cylindrical printed circuit near the cylindrical inside surface and allowing said cylindrical printed circuit to expand along said cylindrical inside surface, and
- wherein said cylindrical printed circuit has coefficients of thermal expansion $a_x$, $a_y$ respectively in the longitudinal direction and along its periphery that are related to the coefficient of thermal expansion $a_c$ of the frame by the condition:

$$0.75 \le \frac{a_x + a_y}{a_c} \le 1.25.$$

* * * * *